United States Patent
Ke et al.

[11] Patent Number: 5,951,196
[45] Date of Patent: Sep. 14, 1999

[54] FRICTIONAL MOUNT FOR ENGAGING A MONITOR IN A PROCESS CHAMBER AND METHOD OF USING

[75] Inventors: Chih-Yuan Ke, Hsin-Chu; Tung-Li Lee, Hsin-chu; Chien-Rong Huang, Hsinchu; Sheng-Kuo Huang, Hsin Chu, all of Taiwan

[73] Assignee: Taiwan Semiconductor Manufacturing Co. Ltd., Hsin-Chu, Taiwan

[21] Appl. No.: 09/074,872

[22] Filed: May 8, 1998

[51] Int. Cl.[6] .................................................... E04H 17/14
[52] U.S. Cl. ........................ 403/297; 403/225; 403/374.4
[58] Field of Search .................... 156/345 MT; 118/712; 16/2.1, 2.3, 2.2; 248/111, 314, 682; 403/297, 292, 291, 225, 290, 373, 374.3, 374.4

[56] References Cited

U.S. PATENT DOCUMENTS 3,021,049  2/1962  Settle ............................... 403/374.4 X
3,619,482  11/1971  Boor ..................................... 16/202 X
5,566,926  10/1996  Voigt ................................... 403/225 X Primary Examiner—Lynne A. Reichard
Assistant Examiner—John R. Cottingham
Attorney, Agent, or Firm—Tung & Associates

[57] ABSTRACT

The present invention discloses a frictional mount for engaging a monitor to a process chamber by utilizing a base member that has at least three apertures therethrough adapted for mounting at least one monitor and two fastening devices, a compressible member formed of a deformable material that has at least three apertures adapted for the at least one monitor and the two fastening devices to pass through, the compressible member is positioned in intimate contact with the base member, and a pressing member that is in intimate contact with the compressible member and has at least one aperture adapted for the at least one monitor to be mounted therethrough and two apertures adapted for receiving two fastening devices such that when the two fastening devices are engaged, the compressible member expands in a lateral direction and frictionally engages the internal peripheral surfaces of a recessed window in the process chamber.

19 Claims, 2 Drawing Sheets

FRICTIONAL MOUNT FOR ENGAGING A MONITOR IN A PROCESS CHAMBER AND METHOD OF USING

FIELD OF THE INVENTION

The present invention generally relates to a frictional mount for engaging a monitor in a process chamber and a method of using such mount and more particularly, relates to a frictional mount for engaging a monitor in a process chamber by utilizing a compressible polymeric material in the mount such that when a pressure is applied to the mount, the polymeric material expands in a lateral direction to frictionally engage a recessed window in the wall of a process chamber and a method for using such mounting device.

BACKGROUND OF THE INVENTION

In the fabrication of semiconductor devices, a silicon wafer or any other semi-conducting substrate must be processed in a plurality of processes conducted in a variety of process machines. In order to produce quality semiconductor devices, a physical or chemical process conducted in a process machine must be closely monitored and controlled. This may be a difficult task since a commercially available process machine may not always provide such capabilities. For instance, as shown in FIG. 1, in a plasma chamber such as that supplied by Applied Materials, Inc. of Santa Clara, Calif. (T-5000 chemical vapor deposition system), the process chamber 10 is only provided with a narrow view port 12 in one of the sidewalls of the chamber. In this specific chamber, the view port has a dimension of 75.8 mm in width, 23.7 mm in depth and 6.32 mm in height. Such a narrow opening makes it very difficult for someone to mount a monitoring device other than observing by the naked eye.

In the process machine shown in FIG. 1, the generation of plasma for deposition must be carefully monitored and controlled in order to ensure the deposition of a high quality film. One of the important parameters to be monitored is the generation of plasma or the intensity of the plasma generated. In general, as intended by the machine manufacturer, the monitoring of plasma discharge is performed through the view port 12 by observation with the naked eye of an operator. Due to the small height of the view port 12, i.e., 6.32 mm, a regular optical detector cannot be mounted directly to the view port when more accurate monitoring than that possible by naked eye is desired. One possible method to accomplish this task is the use of optical fibers to guide out the emitted light during plasma excitation to an optical detector located nearby. Suitable optical detectors such as photo diode, photo multiplier tube, array detectors are commonly used to convert the emission intensity transported by an optical fiber into electronic signals for signal processing.

To further enhance the collective efficiency of the emission signals by using an optical fiber, a collective lens can be added at the front end of the fiber. The use of the additional lens further complicates the mounting of the optical fiber to the narrow view port of the process machine shown in FIG. 1. The mounting of the fiber and the lens to a narrow view port becomes a very difficult task. If they are not mounted properly, these optical components are susceptible to external interferences such as mechanical vibrations which may lead to a dislocation of the fiber/lens from the view port, or a change in the optical signal collective status and thus affecting the results of the optical monitoring of plasma discharge.

In addition, most semiconductor process equipment is a stand alone system which is no longer suitable for further mechanical modifications to be made on the equipment body. It is therefore an important task to design a compact, easy-to-mount and easy-to-dismount mounting device without the need to modify a process equipment such that optical monitoring of a process in a process chamber can be achieved.

It is therefore an object of the present invention to provide a mounting system for engaging a monitor to a process chamber that does not have the drawbacks or shortcomings of the conventional mounting devices.

It is another object of the present invention to provide a mounting device for engaging a monitor to a process chamber wherein the mounting device is engaged to the process chamber solely by frictional means.

It is a further object of the present invention to provide a frictional mount for engaging a monitor to a process chamber such that the operating conditions of the chamber can be monitored by optical fiber.

It is another further object of the present invention to provide a frictional mount for engaging a monitor to a process chamber that has a simple construction of a base member, a compressible member and a pressing member.

It is still another object of the present invention to provide a frictional mount for engaging a monitor to a process chamber by utilizing a compressible plate in a mount which expands in a lateral direction when compressed in a perpendicular direction for providing required frictional force.

It is yet another object of the present invention to provide a frictional mount for engaging a monitor to a process chamber by utilizing a polyurethane compressible plate sandwiched between a base plate and a pressing plate such that when the polyurethane plate is compressed, it expands in the lateral direction to engage the internal peripheral surface of a view port on a process machine.

It is still another further object of the present invention to provide a method for engaging a monitor to a process chamber by providing a compressible plate sandwiched in-between a base plate and a pressing plate such that the compressible plate expands in a lateral direction when compressed by the other two plates to provide the necessary frictional force.

It is yet another further object of the present invention to provide a method for mounting an optical fiber monitor to a plasma deposition chamber by utilizing a polyurethane compressible plate sandwiched between a base plate and a pressing plate such that when the polyurethane plate is compressed, it expands in a lateral direction to provide the necessary frictional force between the mount and a view port of the plasma chamber.

SUMMARY OF THE INVENTION

In accordance with the present invention, a frictional mount for engaging a monitor to a process chamber by utilizing a compressible plate sandwiched between a base plate and a pressing plate such that when the compressible plate is compressed in a perpendicular direction, it expands in a lateral direction to provide the necessary frictional between the mount and a view port on a process chamber. The present invention is further directed to a method for mounting a monitor to a process chamber by utilizing a compressible plate member for providing the necessary frictional force.

In a preferred embodiment, a frictional mount for engaging a monitor in a process chamber is provided which includes a base member that is formed of a rigid material having at least three apertures adapted for mounting at least one monitor and two fastening means therethrough, a compressible member that is formed of a deformable material having at least three apertures adapted for the at least one monitor and the two fastening means to pass through, the compressible plate member is positioned in intimate contact with the base member, and a pressing member that is intimately contacting the compressible member and has at least three apertures adapted for the at least one monitor to be mounted therethrough and two apertures adapted for receiving the two fastening means such that when the two fastening means are engaged, the compressible member expands in a lateral direction and frictionally engaging the internal peripheral surface of a recessed window in the process chamber.

The present invention is further directed to a method for mounting a monitor to a process chamber which can be carried out by the operating steps of first providing a frictional mount constructed of a base plate, a compressible plate and a pressing plate that are intimately positioned together with the compressible plate sandwiched thereinbetween, the mount has at least three apertures therethrough adapted for accepting at least one monitor and two fastening means, then positioning the frictional mount in a recessed window provided in a wall of the process chamber, the recessed window has a width, a height and a depth and each of the dimensions is less than 25.4 mm larger than a corresponding dimension on the mount, and then engaging the fastening device through the two apertures to compress the compressible plate in a perpendicular direction such that the compressible plate expands in a lateral direction to frictionally engaging the recessed window in at least one of the width or height dimension.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a frictional mount for engaging a monitor to a process chamber by utilizing a compressible member formed of a polymeric material that expands in a lateral direction when compressed in a perpendicular direction such that it engages a recessed window in the wall of a process chamber. A suitable polymeric material to be used may be polyurethane or a flurosilicon polymer or any other suitable compressible materials. The present invention frictional mount allows the mounting of at least one monitor, and up to several monitors, into a recessed window for monitoring a single process parameter or a multiple number of process parameters in the process chamber.

Figure 1:
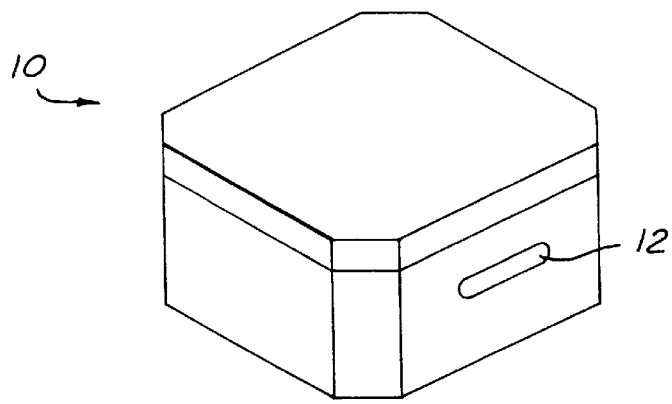
FIG. 1 is a perspective view of a conventional plasma process chamber having a narrow view port.
Figure 2:
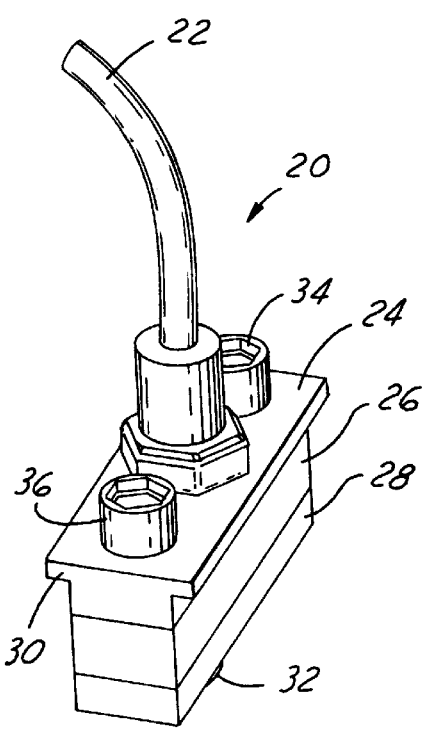
FIG. 2 is a perspective view of a preferred embodiment of the present invention frictional mount having one monitor installed therein.

Referring now to FIG. 2, where it is shown a present invention frictional mount 20 for mounting an optical fiber cable 22 for monitoring plasma discharge in a process chamber that includes a base plate 24, a compressible plate 26 and a pressing plate 28. At the end of the optical fiber 22, a collective lens 32 is also provided to enhance the collective efficiency of the emission signals from the process chamber. The base plate 24, the compressible plate 26 and the pressing plate are held together by fastening means 34 and 36, i.e., mounting screws utilized in this embodiment, such that the three plates are tightly joined together. By further tightening the mounting screws 34 and 36, the pressing plate 28 is pulled toward the base plate 24 and thereby squeezing the compressible plate 26 such that the it expands in a lateral direction. This is shown in FIGS. 4A and 4B.

Figure 4A:
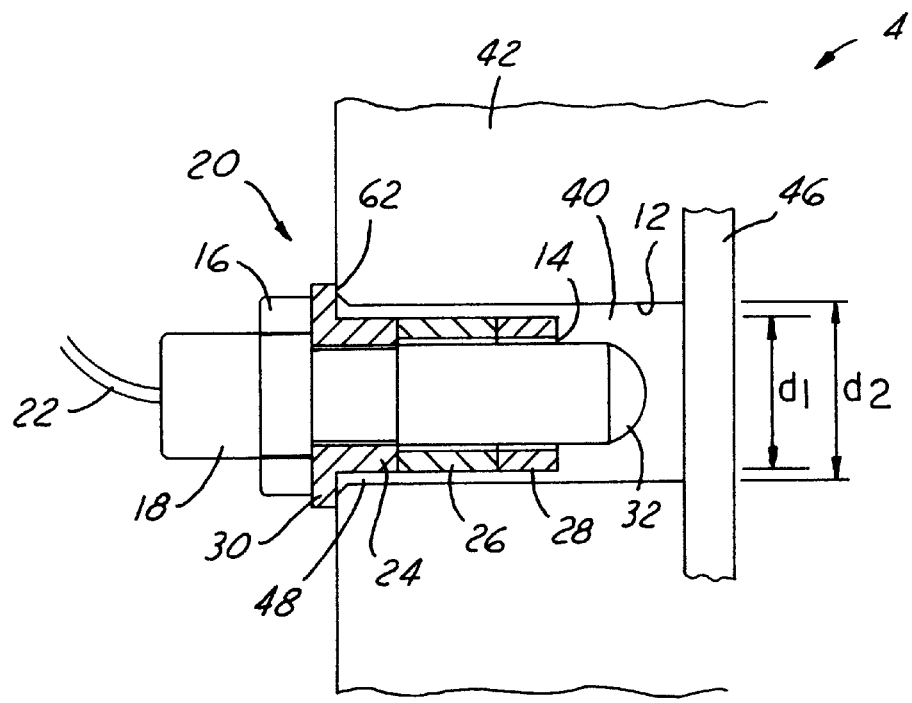
FIG. 4A is an enlarged, cross-sectional view of a present invention frictional mount positioned inside a recessed window on a process chamber.

FIG. 4A shows a present invention frictional mount 20 being positioned in a recessed window 40 which is provided in a wall 42 of a process chamber 44. It should be noted that the recessed window 40 while opens to the environment at its open end 48, is sealed at the other end by a temperature endurance quartz window 46 such that plasma or any other reaction gases can be contained in the process chamber 44. The recessed window 40 is commonly known as a view port in a commercially available process chamber. The term view port and the term recessed window are therefore used interchangeably in this application. When the present invention frictional mount 20 is positioned in the recessed window 40, the important processing parameters such as emissions by the plasma excitation in the chamber can be monitored by the optical fiber 22 through the collection of the emissions by the collective lens 32.

Figure 3:
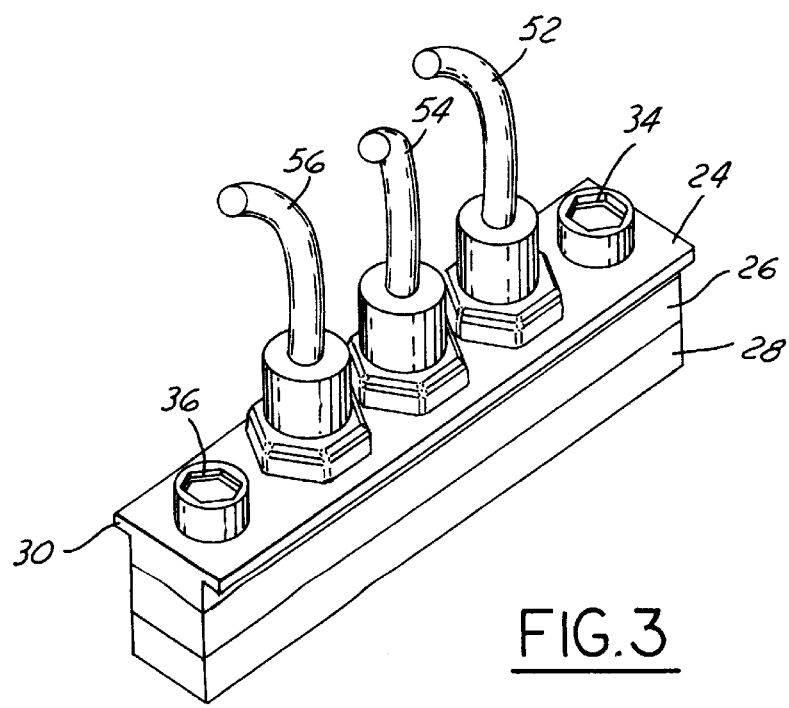
FIG. 3 is a perspective view of another preferred embodiment of the present invention frictional mount having three monitors installed therein.

In a second preferred embodiment, as shown in FIG. 3, a multiple number of optical fibers can be used to monitor different process conditions in a process chamber, i.e., a plasma discharge chamber. This allows the monitoring of a multiple number of parameters that are normally seen in plasma excitation, i.e., a spectrum scan, a multi-channel intensity monitoring, etc. As shown in FIG. 3, optical fibers 52, 54 and 56 are used for monitoring different regions of a plasma spectrum. This can be conducted by either adding a filter means to filter out the unwanted wavelengths, or by adding a grating means to capture only a narrow bandwidth of wavelengths of the emission spectrum.

Figure 4B:
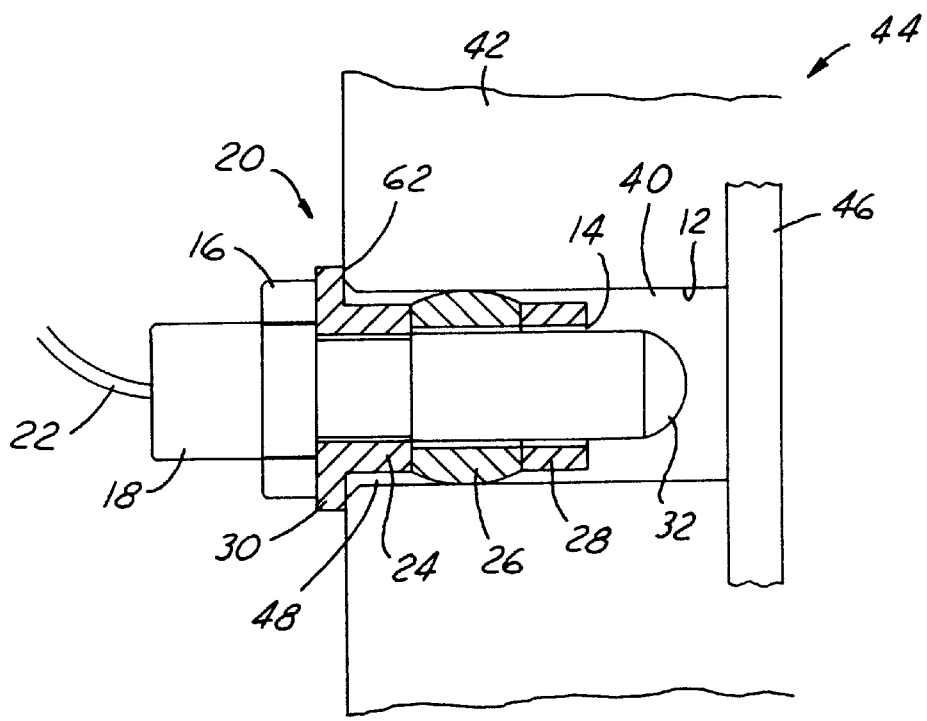
FIG. 4B is an enlarged, cross-sectional view of the frictional mount of FIG. 4A having its plates tightened and its compressible plate frictionally engaging the recessed window in the process chamber.

FIGS. 4A and 4B are enlarged, cross-sectional views showing the present invention frictional mount prior to the expansion of the compressible material and after the expansion of the compressible material. As shown in FIG. 4A, the base plate 24, the compressible plate 26 and the pressing plate 28 are fastened together by mounting screws (not shown). An optical fiber head 18 and a collective lens 32 are then fixed on the base plate 24 by a fastening means 16. The compressible plate 26 and the pressing plate 28 are both provided with an aperture 14 in the center so that the optical fiber head 18 and the collective lens 32 can be inserted in and extended out from the frictional mount 20. An optical fiber 22 can then be directly inserted to the optical fiber head 18. The present invention frictional mount 20 can be inserted into a view port, or a recessed window 40 so that when plasma excitation is produced in the reaction chamber 44, the emissions can be transmitted through the quartz window 46 mounted on the view port 40 and be collected by the collective lens 32 into optical fiber 22. The optical emissions are then sent to an optical detector (not shown) mounted elsewhere for signal processing.

FIG. 4A shows that the height $d_2$ of the opening of the view port 40 should be larger than the height $d_1$ of the frictional mount 20. However, in order for the friction mount to function properly, the height difference, i.e., $d_2-d_1$, should not be much larger than 1 inch (25.4 mm). This is to ensure that the expanded compressible plate in the lateral direction is sufficient to fill the gap between the mount 20 and the view port 40 such that the mount may frictionally engage the view port.

As shown in FIG. 4B, when the two mounting screws (shown in FIG. 2 as 34, 36) are tightened, the distance between the pressing plate 28 and the base plate 24 becomes smaller, i.e., the pressing plate 28 is pulled toward the base plate 24, such that the compressible plate 26 is compressed in a perpendicular direction (along a transverse direction of the frictional mount 20). As a result, the compressible plate 26 expands in a lateral direction, i.e., bulging out, and touches the inside wall 12 of the recessed window 40. It should be noted that, for the present invention to function properly, the compressible plate member must be compressible in a transverse direction such that it is expandable in a lateral direction, as that shown in FIG. 4B. This enables the compressible plate 26 to press against the inside wall 12 of the view port 40 such that a frictional engagement is accomplished between the frictional mount 20 and the view port 40.

The present invention novel device can be advantageously removed from the view port for maintenance or for any other reasons. By simply loosening the two mounting screws 34, 36 (shown in FIG. 2), the compressible plate 26 returns to its original shape such that the frictional mount 20 can be readily removed from the view port 40.

The present invention frictional mount 20 can be further provided with a protruding edge 30 on the base plate 24 to further facilitate the clamping of the frictional mount 22 against an outer edge 62 of the view port 40. This is to prevent the frictional mount 20 from being inserted too far into the view port 40 and causing possible damages to either the collective lens 32 or the quartz window 46.

In a plasma enhanced semiconductor process, the substrate must be heated so that the chamber interior is normally maintained at a temperature higher than 60° C. As a result, the compressible plate used in the present invention novel frictional mount must maintain its flexibility for a prolonged period of operation at such temperatures. Suitable materials to be used for the compressible plate in the present invention novel frictional mount can be polyurethane, flurosilicon polymer, or any other suitable compressible materials. For polyurethane, an elongation of 3~6% and a heat resistance of over 110° C. makes it a suitable material for the present invention application. Furthermore, polyurethane has good machinability and is readily available.

When two or more optical fiber heads and collective lenses are utilized, as shown in FIG. 3, the optical fiber heads and the collective lenses are all mounted between the mounting screws through corresponding apertures on the compressible plate and the pressing plate for inserting the optical fiber heads and the collective lenses therethrough. The mounting screws can be tightened to expand the compressible plate for frictional engagement or can be loosened to release the frictional mount. By connecting two or more optical fiber heads and collective lenses, several optical fibers can be connected to send optical signals to different monitoring systems and to perform multiple optical monitoring of plasma discharge such as spectrum scan, multi-channel intensity monitoring, etc.

The present invention novel frictional mount can be utilized to achieve various benefits and advantages. For instance, the frictional mount which is small in dimension can be used to mount monitors in a narrow space, i.e., a space of 6.32 mm in height in a plasma deposition chamber, or in a very narrow view port of a process chamber that does not allow the mounting of any other bulky monitoring equipment. Secondly, based on the small dimensions of the frictional mount, the view port is not completely blocked by the mount. This allows the machine operator to make visual observations of the plasma discharge condition through the view port. Thirdly, the frictional mount of the present invention can be used repeatedly and is easy to dismount such that it does not create any interference with a preventive maintenance schedule of the semiconductor process chamber. Fourthly, the present invention novel frictional mount has a mounting design that does not require any mechanical modification of the body of a process chamber that is commercially supplied. Fifthly, by connecting two or more optical fiber heads and collective lenses, multiple optical monitoring of plasma excitation can be conducted simultaneously, such as a spectrum scan, a multi-channel intensity monitoring, etc. Other processing parameters such as the intensities of UV heating lamps can also be monitored such that the conditions of the lamps are monitored and replaced before they are burned out. The present invention novel frictional mount can therefore be used in any process chamber as long as the monitoring of process parameters in the chamber is desired.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

1. A frictional mount for engaging a monitor in a process chamber comprising:

a base member formed of a rigid material having at least three apertures adapted for mounting at least one monitor and two bolts therethrough, said at least one monitor comprises a fiber optical monitor, a compressible member formed of a deformable material having at least three apertures adapted for said at least one monitor and said two bolts to pass through, said compressible plate member being positioned in intimate contact with said base member, and a pressing member formed of a rigid material intimately contacting said compressible member having at least one aperture adapted for said at least one monitor to be mounted therethrough and two apertures adapted for said two bolts to engage threads provided in said two apertures such that when said two bolts are tightened, the compressible member is compressed in a perpendicular direction and expands in a lateral direction to frictionally engage peripheral surfaces of an opening in said process chamber.

2. A frictional mount according to claim 1, wherein said compressible member is formed of an polymeric material capable of expanding in a lateral direction.

3. A frictional mount according to claim 2, wherein said polymeric material is an elastomer.

4. A frictional mount according to claim 2, wherein said polymeric material is a polyurethane or a fluorosilicon polymer.

5. A frictional mount according to claim 1, wherein said base member and said pressing member are constructed of a metallic material.

6. A frictional mount according to claim 1, wherein said base member is constructed with a protruding edge which functions as a stop for intimately contacting an outside wall of the process chamber.

7. A method for mounting a monitor to a process chamber comprising the steps of:

providing a frictional mount constructed of a base plate, a compressible plate and a pressing plate intimately positioned together with said compressible plate sandwiched thereinbetween, said mount having at least three apertures therethrough adapted to accept at least one monitor and two fastening means, positioning the frictional mount in a recessed window provided in the wall of the process chamber, said window having a width, a height and a depth and each of said dimensions is less than 25.4 mm larger than a corresponding dimension on said mount, and engaging the two fastening means through said two apertures to compress the compressible plate in a perpendicular direction such that said compressible plate expands in a lateral direction to frictionally engaging the recessed window in at least one of said width and height directions.

8. A method according to claim 7, wherein said fastening means comprises bolts for engaging threads provided in the two apertures in the pressing plate.

9. A method according to claim 7, wherein said step of engaging the fastening device comprises tightening two bolts into threads provided in the two apertures in the pressing plate.

10. A method according to claim 7 further comprising the step of fabricating the compressible plate with a polymeric material that expands readily in a lateral direction when compressed in a perpendicular direction.

11. A method according to claim 7, wherein said at least one monitor is a fiber-optical monitor and said process chamber is a plasma chamber.

12. A process chamber having a monitor engaged therein by a frictional mount comprising:

a chamber body having a recessed opening, a frictional mount having a base member with at least three apertures adapted for mounting said at least one monitor and two fastening means therethrough, a compressible member formed of a deformable material having at least three apertures adapted for said at least one monitor and said two fastening means to pass through, said compressible member being positioned in intimate contact with said base member, and a pressing member intimately contacting said compressible member having at least one aperture adapted for said at least one monitor to be mounted therethrough and two apertures adapted for receiving said two fastening means, said at least one monitor positioned in said at least one cavity having a tip portion pointing to a cavity in said chamber body and a body portion held in place by said compressible member when said two fastening means are engaged to expand said compressible member in a lateral direction to frictionally engage an internal peripheral surface of said recessed opening in said chamber body.

13. A process chamber according to claim 12, wherein said compressible member is formed of a polymeric material capable of expanding in a lateral direction when compressed in a perpendicular direction.

14. A process chamber according to claim 13, herein said polymeric material is an elastomer.

15. A process chamber according to clam 13, wherein said polymeric material is a polyurethane or a fluorosilicon polymer.

16. A process chamber according to claim 12, wherein said at least one monitor is a fiber-optical monitor for detecting plasma.

17. A process chamber according to claim 12, wherein said base member and said pressing member are constricted of a rigid material.

18. A process chamber according to claim 12, wherein said base member is constructed with a protruding edge which functions as a stop for intimately contacting an outside wall of the process chamber.

19. A process chamber according to claim 12, wherein said base member, said compressible member and said pressing member each having five apertures for mounting three monitor heads and two fastening means.

* * * * *